(12) United States Patent
Kirn

(10) Patent No.: US 6,563,378 B1
(45) Date of Patent: May 13, 2003

(54) DIGITAL AMPLIFIER LINEARIZATION USING ANALOG FEEDBACK

(75) Inventor: Larry Kirn, West Bloomfield, MI (US)

(73) Assignee: JAM Technologies, LLC, Boston, MA (US)

( * ) Notice: Subject to any disclaimer, the term of this patent is extended or adjusted under 35 U.S.C. 154(b) by 0 days.

(21) Appl. No.: 09/980,662

(22) PCT Filed: May 19, 2000

(86) PCT No.: PCT/US00/13841
§ 371 (c)(1),
(2), (4) Date: Nov. 15, 2001

(87) PCT Pub. No.: WO00/70762
PCT Pub. Date: Nov. 23, 2000

(51) Int. Cl.[7] ................................................ H03F 3/38
(52) U.S. Cl. .......................... 330/10; 375/238; 330/10; 330/251; 330/207 A
(58) Field of Search ................................ 330/10, 207 A, 330/251; 375/238

(56) References Cited

U.S. PATENT DOCUMENTS

| | | | |
|---|---|---|---|
| 4,337,438 A | * 6/1982 | Guggenbühl et al. | ......... 330/10 |
| 4,524,335 A | * 6/1985 | Yokoyama | .................... 330/10 |
| 5,177,676 A | 1/1993 | Inam et al. | .................... 363/80 |
| 5,659,268 A | 8/1997 | Kesner | ........................ 331/1 A |
| 6,127,885 A | * 10/2000 | Colangelo | ............... 330/207 A |

FOREIGN PATENT DOCUMENTS

JP 401280909 * 11/1989 ................. 330/251

OTHER PUBLICATIONS

Ridley et al. "Multi–loop control for Quasi–resonant Converters" IEEE Transactions on Power Electronics vol. 6 Issue 1 Jan. 1991, pp 28–38.*

* cited by examiner

*Primary Examiner*—Michael B. Shingleton
(74) *Attorney, Agent, or Firm*—Gifford, Krass, Groh, Sprinkle, Anderson & Citkowski, PC

(57) ABSTRACT

An analog voltage is used to directly alter the timebase of a pulse-width converter, thereby modifying a digitally-generated system output with an analog source. The input to the amplifier is coupled to a first counter (101) clocked by a voltage-controlled oscillator (VCO) (113), and second counter (104) driven by a fixed clock (114). The output of the first counter is ultimately delivered to a load device following appropriate filtering (107 and 111). The non-inverting input of a differential amplifier (112) is coupled to the load device, and the inverting input is coupled to the output of the second counter (104). The output of the differential amplifier forms the control voltage input to the VCO, which increases output frequency in response to increasing input voltage. An increase in frequency at the output of the VCO ultimately reduces the load voltage, thereby linearizing an otherwise digital amplifier with an analog signal.

5 Claims, 1 Drawing Sheet

1

DIGITAL AMPLIFIER LINEARIZATION USING ANALOG FEEDBACK

FIELD OF THE INVENTION

This invention relates generally to digital amplifiers and, in particular, to the use of analog feedback to linearize such amplifiers.

BACKGROUND OF THE INVENTION

As digital technology advances, analog sources are diminishing in favor of digital data streams. To effect amplification, early approaches using digital-to-analog converters and analog amplification are evolving to approaches providing high power directly from digital data streams, known as fully digital amplifiers.

The ultimate output of such amplifiers, however, is an analog signal. Linearization techniques using feedback from this output therefore require analog-to-digital conversion in order to interact effectively with the incoming digital data stream. The components required to implement the linearization are just as expensive as the digital-to-analog converters obviated by fully digital designs.

The need therefore exists for a method by which operation of a digital system can be altered using an analog source.

SUMMARY OF THE INVENTION

The present invention provides a technique whereby an analog voltage is used to directly alter the timebase of a pulse-width converter, thus modifying a digitally-generated system output with an analog source.

The input to the amplifier is coupled to a first counter clocked by a voltage-controlled oscillator (VCO), and second counter driven by a fixed clock. The output of the first counter is ultimately delivered to a load device following appropriate filtering. The non-inverting input of a differential amplifier is coupled to the load device, and the inverting input is coupled to the output of the second counter.

The output of the differential amplifier forms the control voltage input to the VCO, which increases output frequency in response to increasing input voltage. An increase in frequency at the output of the VCO ultimately reduces the load voltage, thereby linearizing an otherwise digital amplifier with an analog signal.

DETAILED DESCRIPTION OF THE INVENTION

Figure 1:
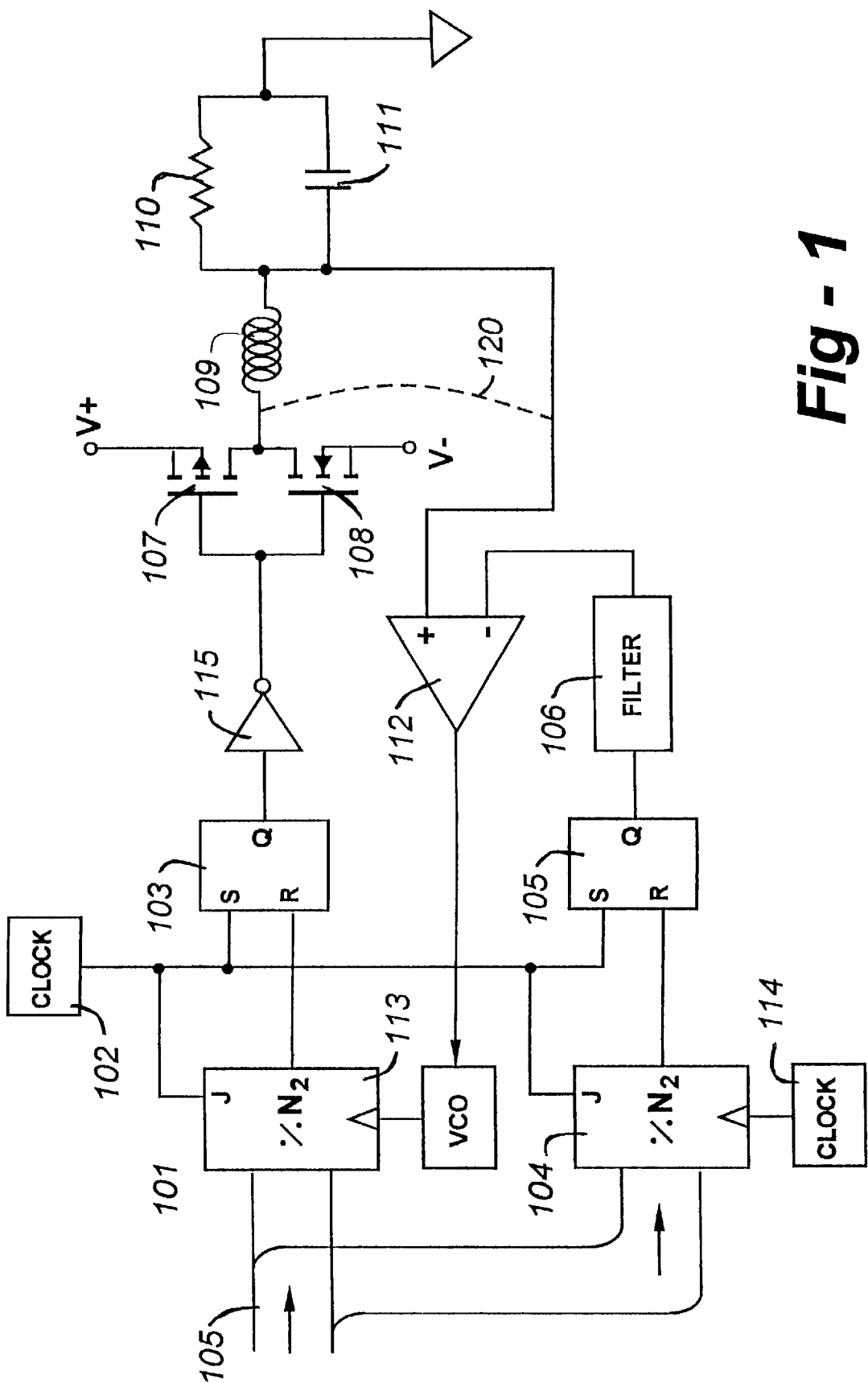
FIG. 1 is a schematic diagram illustrating a preferred embodiment of the invention.

Making reference to the FIGURE, incoming digital data stream 100 is presented as jam inputs to counters 101 and 104, which preload this input upon receipt of clock strobe from source 102. Clock source 102 as well causes the Q outputs of SR flip-flops 103 and 105 to go high via their respective 'S' inputs.

Counters 101 and 104 decrement upon receipt of each pulse from their respective clock sources, namely, VCO 113 and fixed clock source 114. At decrement to zero, the counters cease counting and reset the 'Q' outputs of SR flip-flops 103 and 105, respectively, via their respective 'R' inputs. The 'Q' output of SR flip-flop 103 drives, through inverter 115, switching devices 107 and 108, which sink or source current via inductor 109 to the load 110, filtered by capacitor 111. This voltage applied to load 110 is also supplied to the non-inverting input of differential amplifier 112 as shown or, alternatively, the boost voltage may be used as indicated by broken line 120. High-frequency components of SR flip-flop 105's 'Q' output are removed by low-pass filter 106, the output of which is applied to the inverting input of differential amplifier 112.

The output of differential amplifier 112 provides the control voltage input of voltage-controlled oscillator (VCO) 113, which increases output frequency in response to increasing input voltage. An increase in frequency at the output of VCO 113 then reduces the period of the 'Q' output of SR flip-flop 103, reducing the ultimate voltage at load 110. An analog voltage is thus used to linearize the output of an otherwise digital amplifier.

Although pure feedback is shown, basic manipulations such as integration or differentiation will be apparent to those of skill in the art of amplifier design.

I claim:

1. A linearized digital amplifier operating on an input signal, comprising:

a circuit for determining a deviation between the input signal and a feedback signal so as to generate an analog error signal;

a variable frequency source controlled by the analog error signal;

conversion circuitry for producing a pulse-width modulated signal as a function of both the input signal and the variable frequency source without altering the input signal; and output switching devices operative to deliver power to a load under control of the pulse-width modulated signal.

2. The linearized digital amplifier of claim 1, wherein the frequency source is a voltage-controlled oscillator.

3. The linearized digital amplifier of claim 1, wherein the input signal is a digital stream.

4. A method of linearizing an amplifier, comprising the steps of:

feeding an input signal to first and second pulse generators;

clocking the first pulse generator with a variable frequency source while clocking the second pulse generator at a fixed rate;

coupling the output of the first pulse generator to a load device;

comparing the output of the second pulse generator to a feedback signal; and altering the output of the frequency source as a faction of the comparison.

5. The method of claim 4, wherein the variable frequency source is a voltage-controlled oscillator.

* * * * *